US011205846B2

(12) United States Patent
Greene et al.

(10) Patent No.: US 11,205,846 B2
(45) Date of Patent: Dec. 21, 2021

(54) BEAMFORMING INTEGRATED CIRCUIT HAVING RF SIGNAL PORTS USING A GROUND-SIGNAL TRANSITION FOR HIGH ISOLATION IN A PHASED ANTENNA ARRAY SYSTEM AND RELATED METHODS

(71) Applicant: Anokiwave, Inc., San Diego, CA (US)

(72) Inventors: Kevin Greene, Somerville, MA (US);
Amr Ibrahim, Billerica, MA (US);
Vipul Jain, Irvine, CA (US)

(73) Assignee: Anokiwave, Inc., San Diego, CA (US)

( * ) Notice: Subject to any disclaimer, the term of this patent is extended or adjusted under 35 U.S.C. 154(b) by 0 days.

(21) Appl. No.: 16/986,846

(22) Filed: Aug. 6, 2020

(65) Prior Publication Data

US 2021/0044017 A1 Feb. 11, 2021

Related U.S. Application Data

(60) Provisional application No. 62/884,719, filed on Aug. 9, 2019.

(51) Int. Cl.
*H01Q 21/06* (2006.01)
*H01Q 3/34* (2006.01)
(Continued)

(52) U.S. Cl.
CPC ............ *H01Q 3/34* (2013.01); *H01Q 1/2283* (2013.01); *H01Q 21/065* (2013.01); *H01Q 23/00* (2013.01)

(58) Field of Classification Search
CPC ............ H01Q 3/26–3/40; H01Q 23/00; H01Q 1/2283; H01Q 21/06
See application file for complete search history.

(56) References Cited

U.S. PATENT DOCUMENTS

| 6,380,823 B1 * | 4/2002 | Ikata ................... H03H 9/72 |
| | | 333/133 |
| 10,826,195 B2 | 11/2020 | Madsen et al. |

(Continued)

FOREIGN PATENT DOCUMENTS

| WO | 2018115372 A1 | 6/2018 |
| WO | 2019126826 A1 | 6/2019 |

OTHER PUBLICATIONS

US 10,374,325 B1, 08/2019, Yoon et al. (withdrawn)
(Continued)

*Primary Examiner* — Hasan Islam
(74) *Attorney, Agent, or Firm* — Nutter McClennen & Fish LLP

(57) ABSTRACT

A phased antenna array system is provided that includes a beamforming integrated circuit and beamforming elements in communication with the integrated circuit disposed on a substrate. The beamforming integrated circuit includes multiple radio frequency (RF) signal ports. One or more of the RF signal ports includes an RF signal pad disposed between an edge of the integrated circuit and an internal RF ground pad. The RF signal pad and the internal RF ground pad of the RF signal port are oriented perpendicular with respect to the edge of the integrated circuit. Specifically, the RF signal pad has a first side disposed on or adjacent to the edge of the integrated circuit and an opposing second side that is adjacent to the internal RF ground pad. A method of controlling the phased antenna array system is also provided.

12 Claims, 12 Drawing Sheets

(51) Int. Cl.
*H01Q 23/00* (2006.01)
*H01Q 1/22* (2006.01)

(56) References Cited

U.S. PATENT DOCUMENTS

| | | | |
|---|---|---|---|
| 2012/0313219 A1* | 12/2012 | Chen | H01L 23/4952 |
| | | | 257/532 |
| 2015/0234035 A1* | 8/2015 | Lohoefener | G01S 13/953 |
| | | | 343/702 |
| 2018/0115356 A1* | 4/2018 | Jain | H04L 27/2607 |
| 2018/0287266 A1 | 10/2018 | Madsen et al. | |
| 2019/0312330 A1 | 10/2019 | Madsen et al. | |
| 2021/0005977 A1* | 1/2021 | Franson | H01Q 21/22 |

OTHER PUBLICATIONS

Hong et al., "Millimeter-Wave 5G antennas for smartphones: Overview and experimental demonstration," IEEE Transactions on Antennas and Propagation, vol. 65, Issue No. 12, pp. 6250-6261 (Aug. 2017).

Israel Patent Office, International Search Report for International Application No. PCT/US2020/045182, dated Nov. 17, 2020, together with the Written Opinion of the International Searching Authority, 8 pages.

* cited by examiner

BEAMFORMING INTEGRATED CIRCUIT HAVING RF SIGNAL PORTS USING A GROUND-SIGNAL TRANSITION FOR HIGH ISOLATION IN A PHASED ANTENNA ARRAY SYSTEM AND RELATED METHODS

CROSS-REFERENCE TO RELATED APPLICATION(S)

This patent application claims the benefit of U.S. Provisional Patent Application No. 62/884,719 entitled BEAMFORMING INTEGRATED CIRCUIT HAVING RF SIGNAL PORTS USING A GROUND-SIGNAL TRANSITION FOR HIGH ISOLATION IN A PHASED ANTENNA ARRAY SYSTEM AND RELATED METHODS filed Aug. 9, 2019, which is hereby incorporated herein by reference in its entirety.

FIELD OF THE INVENTION

The invention generally relates to phased arrays and, more particularly, the invention relates to more efficiently managing beam-forming integrated circuits.

BACKGROUND OF THE INVENTION

Active electronically steered antenna systems ("AESA systems," a type of "phased array system") form electronically steerable beams for a wide variety of radar and communications systems. To that end, AESA systems typically have a plurality of beam-forming elements (e.g., antennas) that transmit and/or receive energy so that the signal on each beam-forming element can be coherently (i.e., in-phase and amplitude) combined (referred to herein as "beamforming" or "beam steering"). Specifically, many AESA systems implement beam steering by providing a unique radio frequency ("RF") phase shift and gain setting (phase and gain together constitute a complex beam weight) between each beam-forming element and a beam-forming or summation point.

The number and type of beam-forming elements in the phased array system can be selected or otherwise configured specifically for a given application. A given application may have a specified minimum equivalent/effective isotropically radiated power ("EIRP") for transmitting signals. Additionally, or alternatively, a given application may have a specified minimum G/T (analogous to a signal-to-noise ratio) for receiving signals, where:
  G denotes the gain or directivity of an antenna, and
  T denotes the total noise temperature of the receive system including receiver noise figure, sky temperature, and feed loss between the antenna and input low noise amplifier.

SUMMARY OF VARIOUS EMBODIMENTS

In accordance with one embodiment of the invention, a phased antenna array system includes a beamforming integrated circuit having multiple radio frequency (RF) signal ports disposed on a substrate and multiple beamforming elements disposed on the substrate in communication with the beamforming integrated circuit. One or more of the RF signal ports includes an RF signal pad disposed between an edge of the integrated circuit and an internal RF ground pad. As discussed in more detail below, the RF signal pad and the internal RF ground pad of the RF signal port are oriented perpendicular with respect to the edge of the integrated circuit. The RF signal pad has a first side disposed on or adjacent to the edge of the integrated circuit and an opposing second side that is adjacent to the internal RF ground pad. The RF signal pad and the internal RF ground pad can be electrically connected to an exposed metal layer on the substrate that forms a ground-signal (GS) transition between the beamforming integrated circuit and the substrate.

The RF signal ports can include at least one RF common port for connecting to RF circuitry disposed on the substrate and at least one RF antenna port for connecting to at least one of the beamforming elements disposed on the substrate. In some embodiments, the RF common port and the RF antenna port are separated by at least four pad locations on the integrated circuit. In some embodiments, a plurality of RF antenna ports can be separated by at least one pad location on the integrated circuit.

In accordance with another embodiment of the invention, a method is provided for controlling a phased antenna array system. The phase antenna array system includes a beamforming integrated circuit having multiple RF signal ports disposed on a substrate and multiple beamforming elements disposed on the substrate in communication with the beamforming integrated circuit. The method includes transmitting a signal received on a first signal port among the RF signal ports through an RF channel defined in the beamforming integrated circuit to a second signal port among the RF signal ports. The first signal port and/or the second signal port including an RF signal pad disposed between an edge of the integrated circuit and an internal RF ground pad.

As described in more detail below, the RF signal pad and the internal RF ground pad of the RF signal port are oriented perpendicular with respect to the edge of the integrated circuit. The RF signal pad has a first side disposed on or adjacent to the edge of the integrated circuit and an opposing second side that is adjacent to the internal RF ground pad. The RF signal pad and the internal RF ground pad can be electrically connected to an exposed metal layer on the substrate that forms a ground-signal (GS) transition between the beamforming integrated circuit and the substrate.

The RF signal ports can include at least one RF common port for connecting to RF circuitry disposed on the substrate and at least one RF antenna port for connecting to at least one of the beamforming elements disposed on the substrate. In some embodiments, the RF common port and the RF antenna port are separated by at least four pad locations on the integrated circuit. In some embodiments, a plurality of RF antenna ports can be separated by at least one pad location on the integrated circuit.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a phased antenna array system can include one or more beamforming integrated circuits having multiple radio frequency (RF) signal ports. Each integrated circuit is mounted on a printed circuit board (PCB) or other substrate, such that the RF signal ports can be electrically connected to antenna elements and/or other RF circuitry of the PCB. It can be desirable, if not important, to electromagnetically isolate the RF signal ports from one another to prevent on-chip RF signal interference, e.g., for accurate phase and amplitude control of the phased antenna array system.

To that end, at least some of the RF signal ports of a beamforming integrated circuit are configured using a ground-signal ("GS") pad topology. For example, an RF signal port can be configured to include an RF signal interface (or "pad") disposed on the integrated circuit between a perimeter or an edge of the integrated circuit and an internal RF ground interface or pad disposed on an opposite side of the RF signal pad. When the integrated circuit is mounted on the PCB, electromagnetic coupling between the RF signal pad and the internal RF ground pad facilitates signal isolation between the port and other RF signal ports of the integrated circuit.

As described in illustrated embodiments below, an advantage of using RF signal ports having GS pad layouts includes the ability to facilitate signal isolation on the integrated circuit with less space (e.g., pads) as compared to conventional RF ports. Further advantages can include the manufacture of integrated circuits having smaller die sizes without reducing RF port count, integrated circuits having increased RF port counts along the perimeter of the integrated circuit, integrated circuits having increased non-RF port counts along the perimeter of the perimeter or edge of the integrated circuit. Persons skilled in the art will recognize other advantages of integrated circuits using the illustrative RF signal ports.

Details of illustrative embodiments are discussed below.

Figure 1:
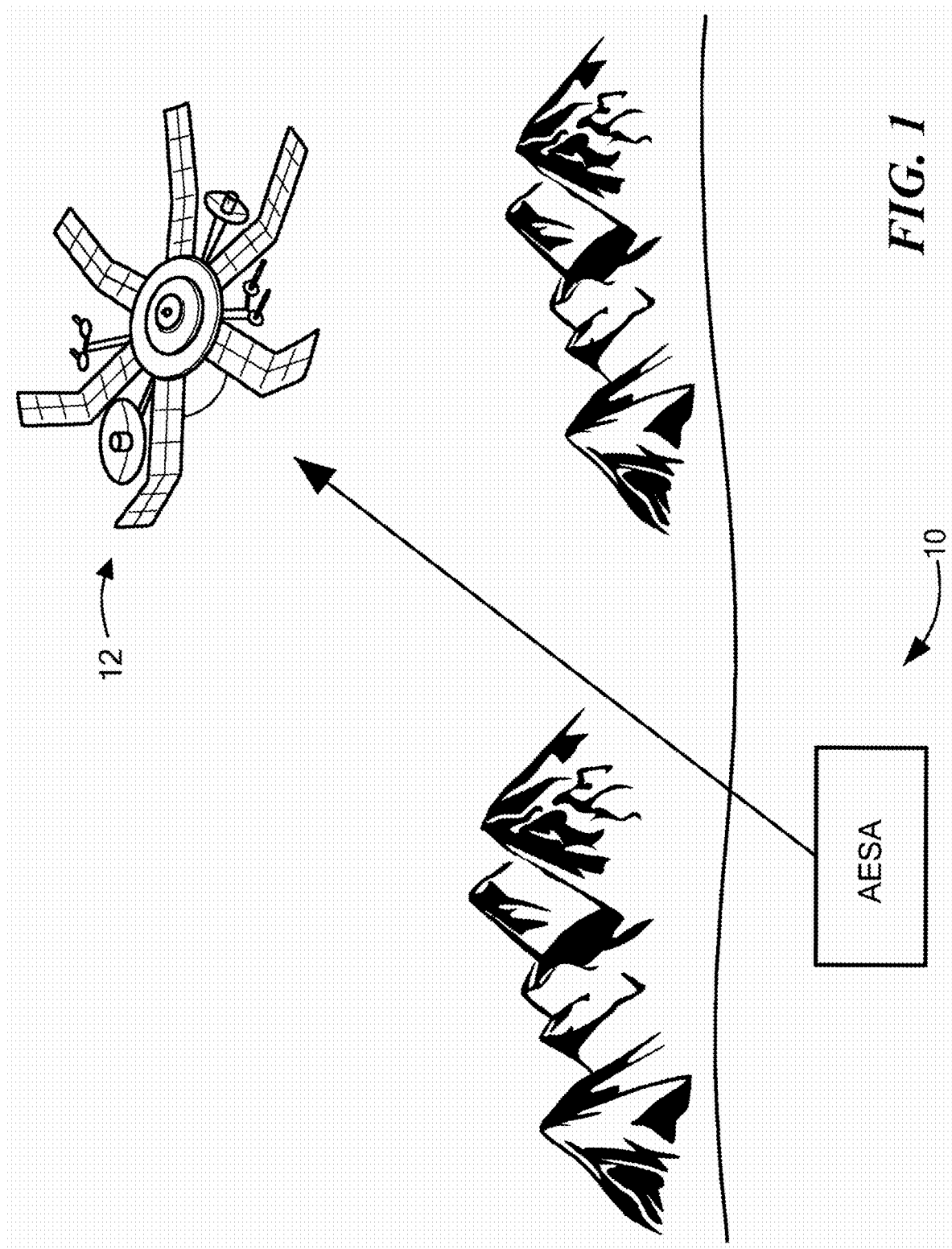
FIG. 1 schematically shows an active electronically steered antenna system ("AESA system") configured in accordance with illustrative embodiments of the invention and communicating with a satellite.

FIG. 1 schematically shows an active electronically steered antenna system ("AESA system 10") configured in accordance with illustrative embodiments of the invention and communicating with an orbiting satellite 12. A phased array (discussed below and identified by reference number "10A") implements the primary functionality of the AESA system 10. Specifically, as known by those skilled in the art, the phased array forms one or more of a plurality of electronically steerable beams that can be used for a wide variety of applications. As a satellite communication system, for example, the AESA system 10 preferably is configured operate at one or more satellite frequencies. Among others, those frequencies may include the Ka-band, Ku-band, and/or X-band.

The satellite communication system may be part of a cellular network operating under a known cellular protocol, such as the 3G, 4G, or 5G protocols. Accordingly, in addition to communicating with satellites, the system may communicate with earth-bound devices, such as smartphones or other mobile devices, using any of the 3G, 4G, or 5G protocols. As another example, the satellite communication system may transmit/receive information between aircraft and air traffic control systems. Of course, those skilled in the art may use the AESA system 10 (implementing the noted phased array 10A) in a wide variety of other applications, such as broadcasting, optics, radar, etc. Some embodiments may be configured for non-satellite communications and instead communicate with other devices, such as smartphones (e.g., using 4G or 5G protocols). Accordingly, discussion of communication with orbiting satellites 12 is not intended to limit all embodiments of the invention.

Figure 2A:
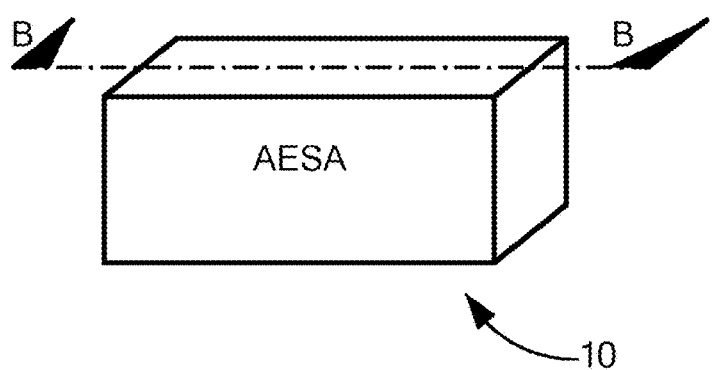
FIGS. 2A and 2B schematically show generalized diagrams of an AESA system that may be configured in accordance with illustrative embodiments of the invention.
Figure 2B:
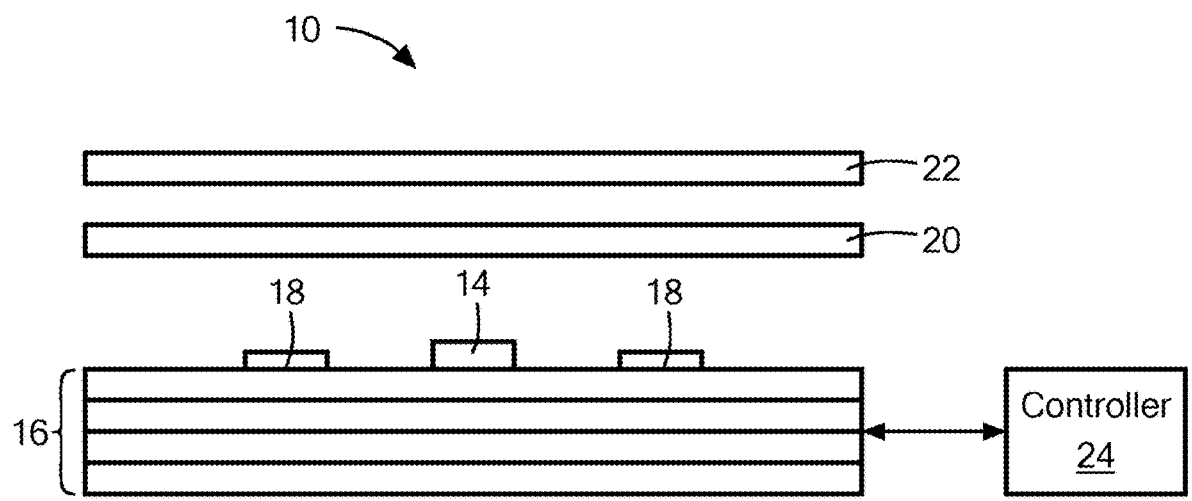

FIGS. 2A and 2B schematically show generalized diagrams of the AESA system 10 configured in accordance with illustrative embodiments of the invention. Specifically, FIG. 2A schematically shows a block diagram of the AESA system 10, while FIG. 2B schematically shows a cross-sectional view of a small portion of the same AESA system 10 across line B-B. This latter view shows a single silicon integrated circuit 14 mounted onto a substrate 16 between two transmit, receive, and/or dual transmit/receive elements 18, i.e., on the same side of a supporting substrate 16 and juxtaposed with the two elements 18. In alternative embodiments, however, the integrated circuit 14 could be on the other side/surface of the substrate 16. The AESA system 10 also has a polarizer 20 to selectively filter signals to and from the phased array 10A, and a radome 22 to environmentally protect the phased array of the system 10. A separate antenna controller 24 (FIG. 2B) electrically connects with the phased array to calculate beam steering vectors for the overall phased array, and to provide other control functions.

Figure 3A:
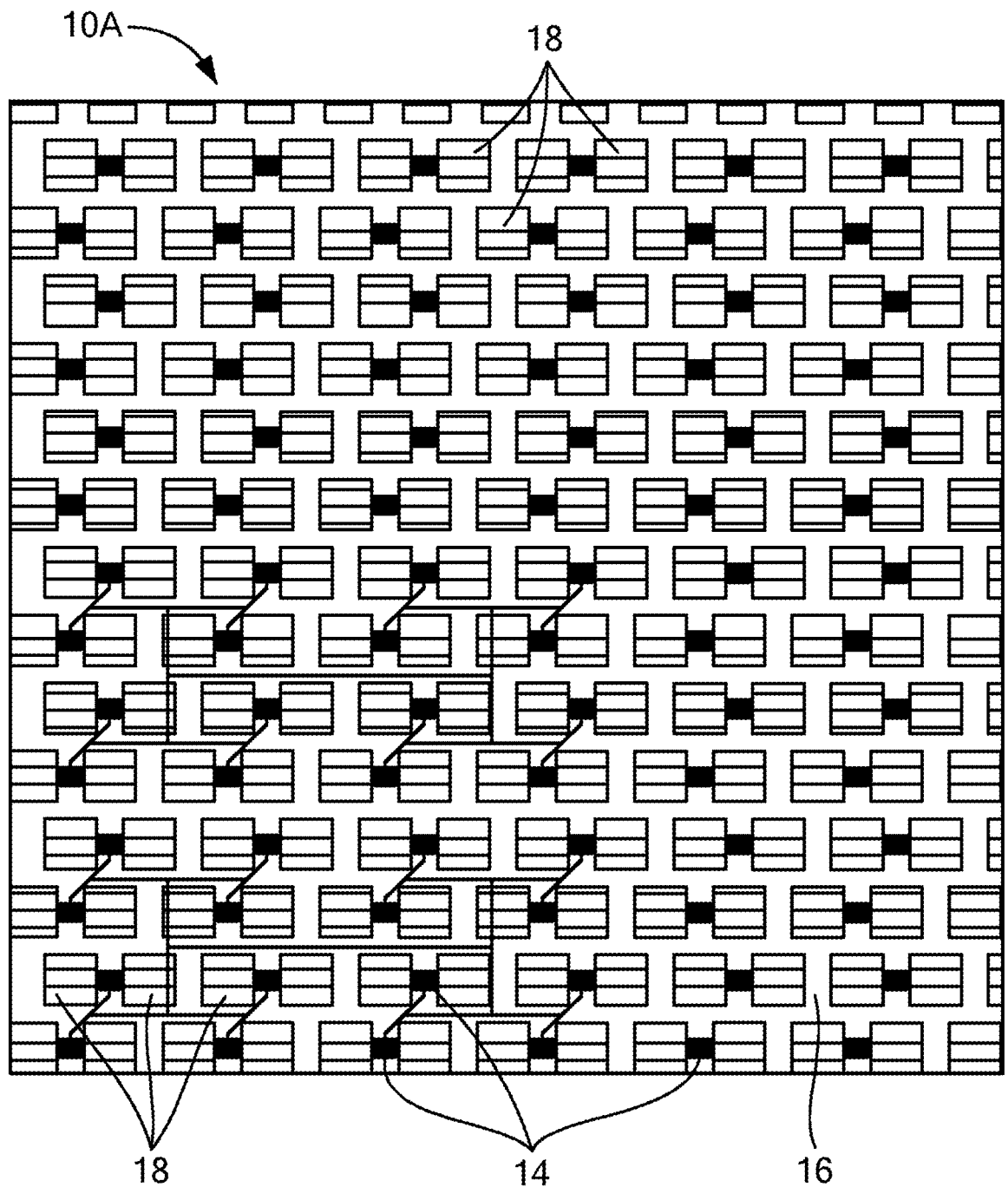
FIG. 3A schematically shows a plan view of a laminar printed circuit board portion of an AESA configured in accordance with illustrative embodiments of the invention.

FIG. 3A schematically shows a plan view of a primary portion of an AESA system 10 that may be configured in accordance with illustrative embodiments of the invention. In a similar manner, FIG. 3B schematically shows a close-up of a portion of the phased array 10A of FIG. 3A.

Specifically, the AESA system 10 of FIG. 3A is implemented as a laminar phased array 10A having a laminated printed circuit board 16 (i.e., acting as the substrate and also identified by reference number "16") supporting the above noted plurality of elements 18 and integrated circuits 14. The elements 18 preferably are formed as a plurality of square or rectangular patch antennas oriented in a triangular patch array configuration. In other words, each element 18 forms a triangle with two other adjacent elements 18. When compared to a rectangular lattice configuration, this triangular lattice configuration requires fewer elements 18 (e.g., about 15 percent fewer in some implementations) for a given grating lobe free scan volume. Other embodiments, however, may use other lattice configurations, such as a pentagonal configuration or a hexagonal configuration. Moreover, despite requiring more elements 18, some embodiments may use a rectangular lattice configuration. Like other similar phased arrays, the printed circuit board 16 also may have a ground plane (not shown) that electrically and magnetically cooperates with the elements 18 to facilitate operation.

Figure 3B:
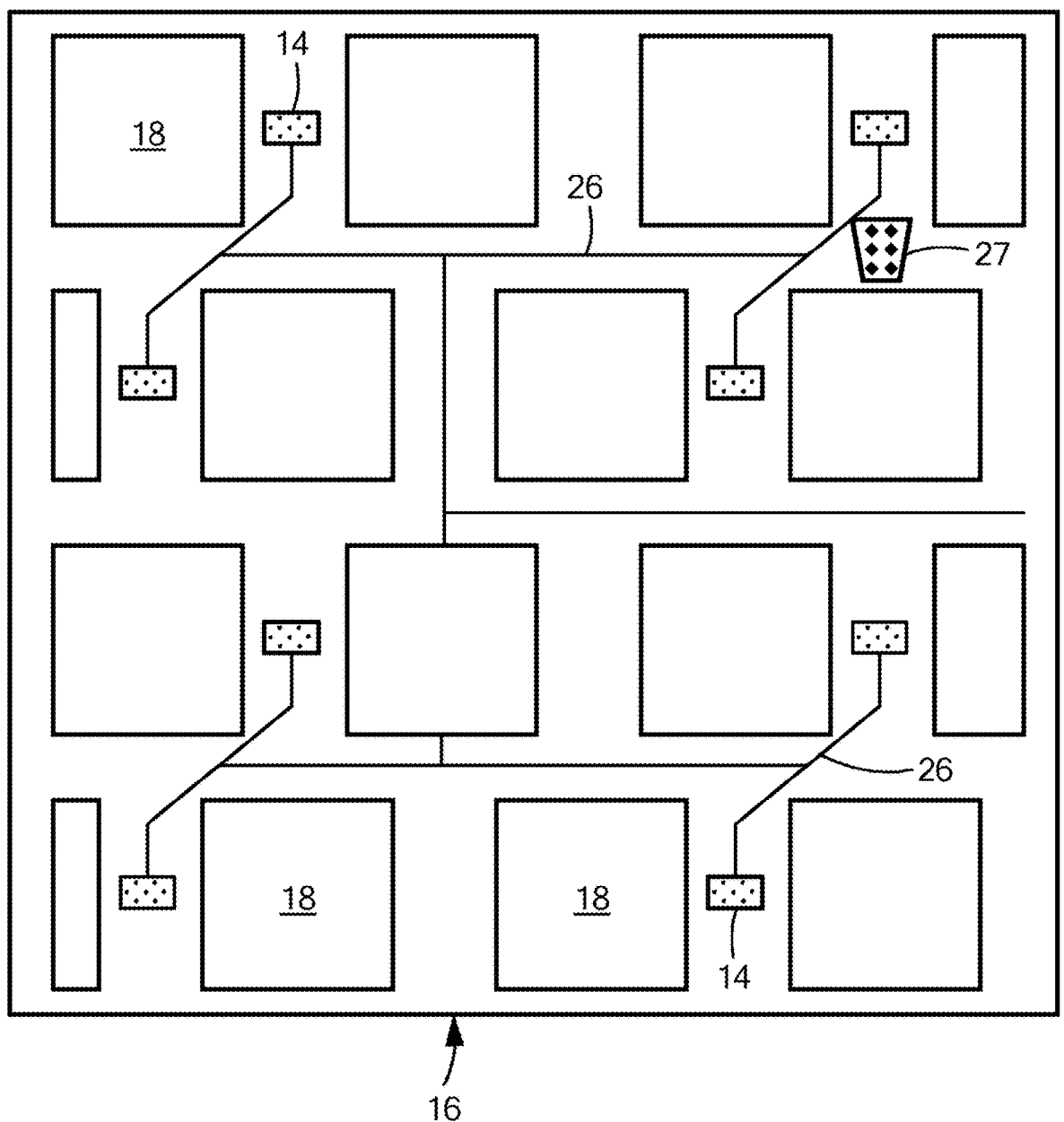
FIG. 3B schematically shows a close-up of a portion of the laminated printed circuit board of FIG. 3A.

Indeed, the array shown in FIGS. 3A and 3B is a small phased array 10A. Those skilled in the art can apply principles of illustrative embodiments to laminar phased arrays 10A with hundreds, or even thousands, of elements 18 and integrated circuits 14. In a similar manner, those skilled in the art can apply various embodiments to smaller phased arrays 10A.

As a patch array, the elements 18 have a low profile. Specifically, as known by those skilled in the art, a patch antenna (i.e., the element 18) typically is mounted on a flat surface and includes a flat rectangular sheet of metal (known as the patch and noted above) mounted over a larger sheet of metal known as a "ground plane." A dielectric layer between the two metal regions electrically isolates the two sheets to prevent direct conduction. When energized, the patch and ground plane together produce a radiating electric field. Illustrative embodiments may form the patch antennas using conventional semiconductor fabrication processes, such as by depositing one or more successive metal layers on the printed circuit board 16. Accordingly, using such fabrication processes, each radiating element 18 in the phased array 10A should have a very low profile.

The phased array 10A can have one or more of any of a variety of different functional types of elements 18. For example, the phased array 10A can have transmit-only elements 18, receive-only elements 18, and/or dual mode receive and transmit elements 18 (referred to as "dual-mode elements 18"). The transmit-only elements 18 are configured to transmit outgoing signals (e.g., burst signals) only, while the receive-only elements 18 are configured to receive incoming signals only. In contrast, the dual-mode elements 18 are configured to either transmit outgoing burst signals, or receive incoming signals, depending on the mode of the phased array 10A at the time of the operation. Specifically, when using dual-mode elements 18, the phased array 10A can be in either a transmit mode, or a receive mode. The noted controller 24, at least in part, controls the mode and operation of the phased array 10A, as well as other array functions.

The AESA system 10 has a plurality of the above noted integrated circuits 14 (mentioned above with regard to FIG. 2B) for controlling operation of the elements 18. Those skilled in the art often refer to these integrated circuits 14 as "beam steering integrated circuits," or "beam-forming integrated circuits."

Each integrated circuit 14 preferably is configured with at least the minimum number of functions to accomplish the desired effect. Indeed, integrated circuits 14 for dual mode elements 18 are expected to have some different functionality than that of the integrated circuits 14 for the transmit-only elements 18 or receive-only elements 18. Accordingly, integrated circuits 14 for such non-dual-mode elements 18 typically have a smaller footprint than the integrated circuits 14 that control the dual-mode elements 18. Despite that, some or all types of integrated circuits 14 fabricated for the phased array 10A can be modified to have a smaller footprint.

As an example, depending on its role in the phased array 10A, each integrated circuit 14 may include some or all of the following functions:
phase shifting,
amplitude controlling/beam weighting,
switching between transmit mode and receive mode,
output amplification to amplify output signals to the elements 18,
input amplification for received RF signals (e.g., signals received from the satellite 12), and
power combining/summing and splitting between elements 18.

Indeed, some embodiments of the integrated circuits 14 may have additional or different functionality, although illustrative embodiments are expected to operate satisfactorily with the above noted functions. Those skilled in the art can configure the integrated circuits 14 in any of a wide variety of manners to perform those functions. For example, the input amplification may be performed by a low noise amplifier, the phase shifting may use conventional active phase shifters, and the switching functionality may be implemented using conventional transistor-based switches.

Each integrated circuit 14 preferably operates on at least one element 18 in the array. For example, one integrated circuit 14 can operate on two or four different elements 18. Of course, those skilled in the art can adjust the number of elements 18 sharing an integrated circuit 14 based upon the application. For example, a single integrated circuit 14 can control two elements 18, three elements 18, five elements 18, six elements 18, seven elements 18, eight elements 18, etc., or some range of elements 18. Sharing the integrated circuits 14 between multiple elements 18 in this manner reduces the required total number of integrated circuits 14, correspondingly reducing the required size of the printed circuit board 16.

As noted above, the dual-mode elements 18 may operate in a transmit mode, or a receive mode. To that end, the integrated circuits 14 may generate time division diplex or duplex waveforms so that a single aperture or phased array 10A can be used for both transmitting and receiving. In a similar manner, some embodiments may eliminate a commonly included transmit/receive switch in the side arms of the integrated circuit 14. Instead, such embodiments may duplex at the element 18. This process can be performed by isolating one of the elements 18 between transmit and receive by an orthogonal feed connection.

RF interconnect and/or beam-forming lines 26 electrically connect the integrated circuits 14 to their respective elements 18. To further minimize the feed loss, illustrative embodiments mount the integrated circuits 14 as close to their respective elements 18 as possible. Specifically, this close proximity preferably reduces RF interconnect line lengths, reducing the feed loss. To that end, each integrated circuit 14 preferably is packaged either in a flip-chipped configuration using wafer level chip scale packaging (WLCSP), or a traditional package, such as quad flat no-leads package (QFN package). While other types of packaging may suffice, WLCSP techniques are preferred to minimize real estate on the substrate 16.

In addition to reducing feed loss, using WLCSP techniques reduces the overall footprint of the integrated circuits 14, enabling them to be mounted on the top face of the printed circuit board 16 with the elements 18—providing more surface area for the elements 18.

It should be reiterated that although FIGS. 3A and 3B show the AESA system 10 with some specificity (e.g., the layout of the elements 18 and integrated circuits 14), those skilled in the art may apply illustrative embodiments to other implementations. For example, as noted above, each integrated circuit 14 can connect to more or fewer elements 18, or the lattice configuration can be different. Accordingly, discussion of the specific configuration of the AESA system 10 of FIG. 3A (and other figures) is for convenience only and not intended to limit all embodiments.

Figure 4:
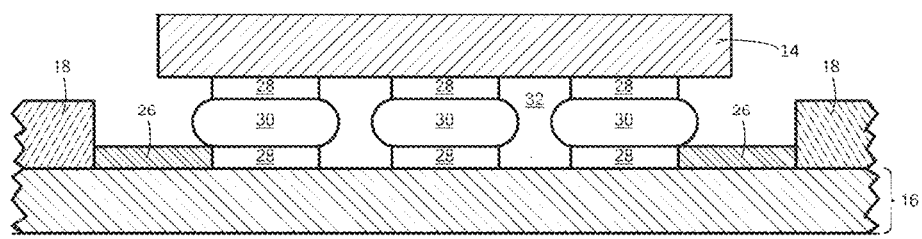
FIG. 4 schematically shows a cross-sectional view of the laminated printed circuit board of FIG. 3A to highlight the mounting of its integrated circuits.

FIG. 4 schematically shows a cross-sectional view of the layout of components on the laminated printed circuit board 16 of FIG. 3A to highlight the flip-chip mounting of its integrated circuits 14. The integrated circuit 14 in this drawing intentionally is enlarged to show details of a flip-chip mounting technique. Unlike techniques that permit input/output ("I/O") only on the edge of the integrated circuit 14, flip-chip mounting permits I/O on interior portions of the integrated circuit 14.

As shown, the integrated circuit 14 has a plurality of pads 28 aligned with a plurality of corresponding pads 28 on the printed circuit board 16. These opposing pads 28 on the integrated circuit 14 and the printed circuit board 16 may be considered to form pairs of pads 28. Solder 30 (e.g., solder balls) electrically connects each the pads in corresponding pairs of pads 28. Interconnect lines, traces, and other electrical interconnects on/in the printed circuit board 16 (e.g., lines 26) thus permit the integrated circuit 14 to communicate with other elements 18 through this electrical interface.

The embodiment shown in FIG. 4 forms a space or void (identified by reference number "32") between the bottom of the integrated circuit 14 (from the perspective of this drawing) and the top surface of the printed circuit board 16. This space 32 may remain an open void—containing no material. Some embodiments may take advantage of this extra space 32 to add further components, such as additional circuit elements, without requiring more circuit board space. Alternatively, this space 32 may contain fill material (not shown) for further stability and thermal management of the integrated circuit 14.

Other embodiments, however, still may use similar integrated circuits 14, but not use flip-chip mounting techniques. Instead, other mounting techniques may couple the integrated circuits 14 with the substrate 16. Among other things, those techniques may incorporate surface mounting, or wirebond mounting with the integrated circuit 14 rotated 180 degrees from the orientation of FIG. 4. Similar embodiments may use conventional packaging, such as quad-flat leadframe packages (i.e., "QFN" packages). Accordingly, discussion of flip chip mounting techniques is but one of a variety of different techniques that may be used with various embodiments of the invention.

Figure 5:
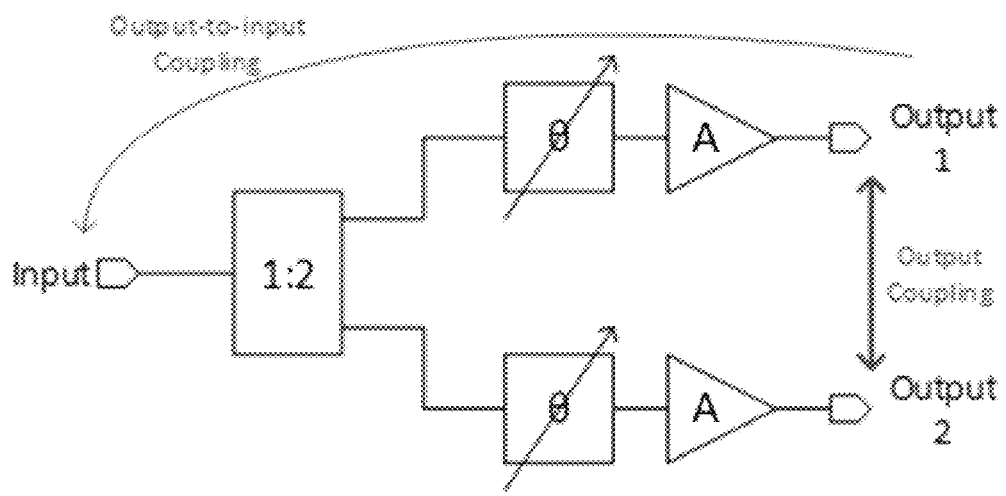
FIG. 5 schematically shows a generic representation of an RF channel in a beamforming integrated circuit for illustrating the concept of signal interference due to electromagnetic coupling between RF signal ports.

As shown in FIG. 5, beamforming integrated circuits for a phased antenna array system typically include one or more transceiver chains (sometimes referred to herein as "channels"). Each channel can have a phase shifter θ and/or a gain amplifier A for manipulating RF signals received at an RF input port (e.g., Input) and transmitted through an RF output port (e.g., Output 1/Output 2). Such beamforming circuits can also include a splitter/combiner S to facilitate signal multiplexing and/or de-multiplexing between two or more channels.

A concern typically associated with beamforming integrated circuit design includes the prevention of electromagnetic coupling between RF ports. For example, electromagnetic coupling of an RF output port (e.g. Output 1) and an RF input port (e.g., Input) can distort RF signals received at the RF input port and/or RF signals transmitted through the RF output port. Electromagnetic coupling of two or more RF output ports (e.g., Output 1 and Output 2) can also distort their respective RF output signals.

Accordingly, in a beamforming integrated circuit having multiple RF ports, it can be desirable, if not important, to electromagnetically isolate the RF ports from one another to prevent such signal interference and facilitate accurate phase and amplitude control for a phased antenna array system. For example, to achieve equal amplitude and phase error contributions in the circuit shown in FIG. 5, the magnitude of isolation between an RF input port and an RF output port depends, at least in part, on the magnitude of an RF gain applied by a respective gain amplifier G in comparison to the isolation between the two RF output ports (e.g., Output 1 and Output 2).

Figure 6A:
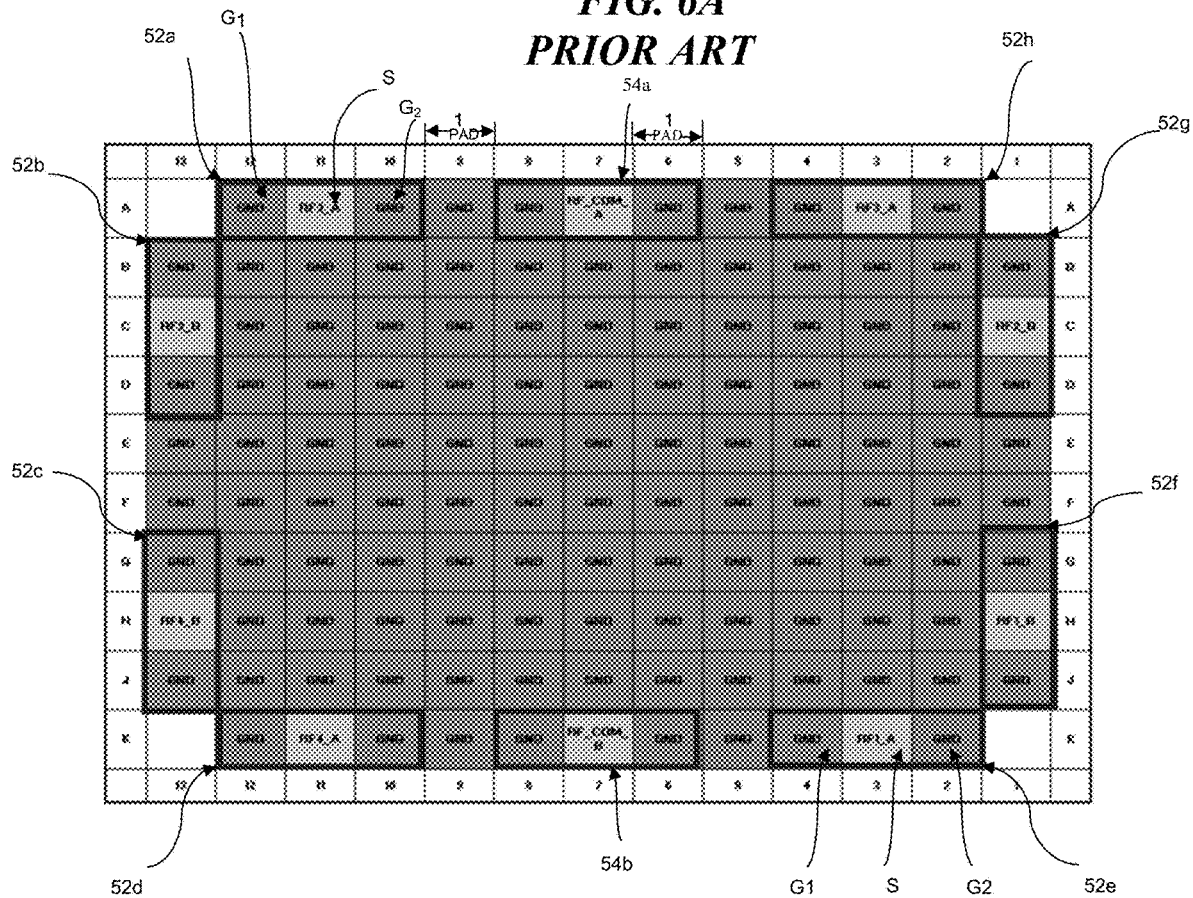
FIG. 6A schematically shows a conventional beamforming integrated circuit that includes RF signal ports having a ground-signal-ground (GSG) pad layout configured for signal isolation.
Figure 6B:
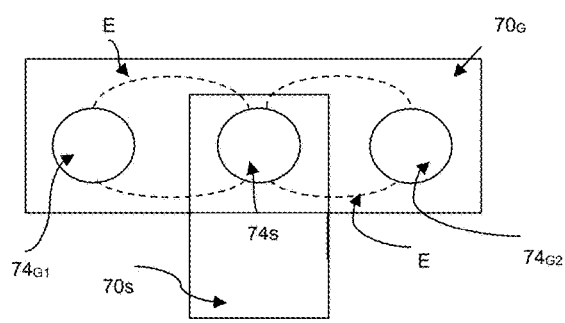
FIG. 6B schematically shows an RF signal port of the conventional beamforming integrated circuit shown in FIG. 6A connected to respective signal and ground interfaces of on a printed circuit board.

FIGS. 6A and 6B schematically show a conventional beamforming integrated circuit 50 that includes RF antenna ports 52a, 52b, 52c, 52d, 52e, 52f, 52g, 52h, (collectively RF ports 52) and RF common ports 54a and 54b (collectively 54) that drive the RF antenna ports. As shown, each of the RF ports 52 and 54 has a ground-signal-ground (GSG) pad layout for electromagnetically isolating the ports from one another. For example, each RF port includes a first RF ground pad $G_1$, an RF signal pad S, and a second RF ground pad $G_2$, disposed linearly on an edge of the integrated circuit 50.

As shown in FIG. 6B, when the integrated circuit 50 is mounted on a PCB or other substrate, the GSG pads are respectively connected to an RF ground interface $70_G$ and an RF signal interface $70_S$ of the PCB via solder bumps $74_{G1}$, $74_S$, and $74_{G2}$. As will be readily understood by a person skilled in the art, the GSG transition from the integrated circuit to the PCB can generate a symmetrical electromagnetic field E between RF signal and RF ground that carry RF current—and thereby electromagnetically isolate the port from surrounding RF ports.

The magnitude of isolation between RF ports is strongly dependent on their separation distance from one another. Therefore, the RF antenna ports 52 and the RF common ports 54 are typically placed at locations on the integrated circuit 50 that maximize a separation distance between them. However, placement of RF ports can have certain constraints. For example, mechanical stress simulations have shown that corner locations of an integrated circuit die pose the highest risk of failure in a wafer-level chip-scale-package (WLCSP) and thus are not typically used for RF port placements. Further, GSG transitions typically require that an RF signal pad be at least three pad locations away from the edge of the integrated circuit die, further reducing the separation distance between respective RF ports.

In view of the foregoing constraints, the separation distance between some of the RF antenna ports 52 and RF common ports 54 can be less than optimal, e.g., for signal isolation. For example, in the illustrative 10×13 pad layout of FIG. 6A, the minimum achievable spacing between the RF antenna ports 52a, 52b and the RF common port 54a that drives them is one (1) pad location (assuming corner pads cannot be used for reliability purposes). Further, the RF antenna ports 52a and 52b cannot be placed on the same edge as the RF antenna ports 52c and 52d (or RF antenna ports 52g and 52h) without sharing RF ground pads or growing the dimensions of the integrated circuit die (e.g., the Y-dimension in FIG. 6A). Such a configuration can be problematic for coupling between adjacent RF antenna ports.

To address at least some of the foregoing disadvantages, illustrative embodiments of beamforming integrated circuits are provided herein that include RF ports having a ground-signal (GS) pad layout. A GS transition from an integrated circuit to a printed circuit board can realize comparable, if not better, isolation and insertion loss relative to GSG transitions with fewer pads (e.g., two instead of three). GS transitions also reduce the number of the pads needed along the perimeter of the integrated circuit for RF signal and RF ground, thus enabling the manufacture of smaller die sizes. Adjacent RF antenna ports can also be placed close together (e.g., a single ground pad separation) while maintaining sufficiently high isolation. Illustrative embodiments can improve mechanical reliability by allowing corner pads, known to be most susceptible to mechanical stress, to be removed or used for redundant purposes due to the need for fewer RF pads.

Figure 7A:
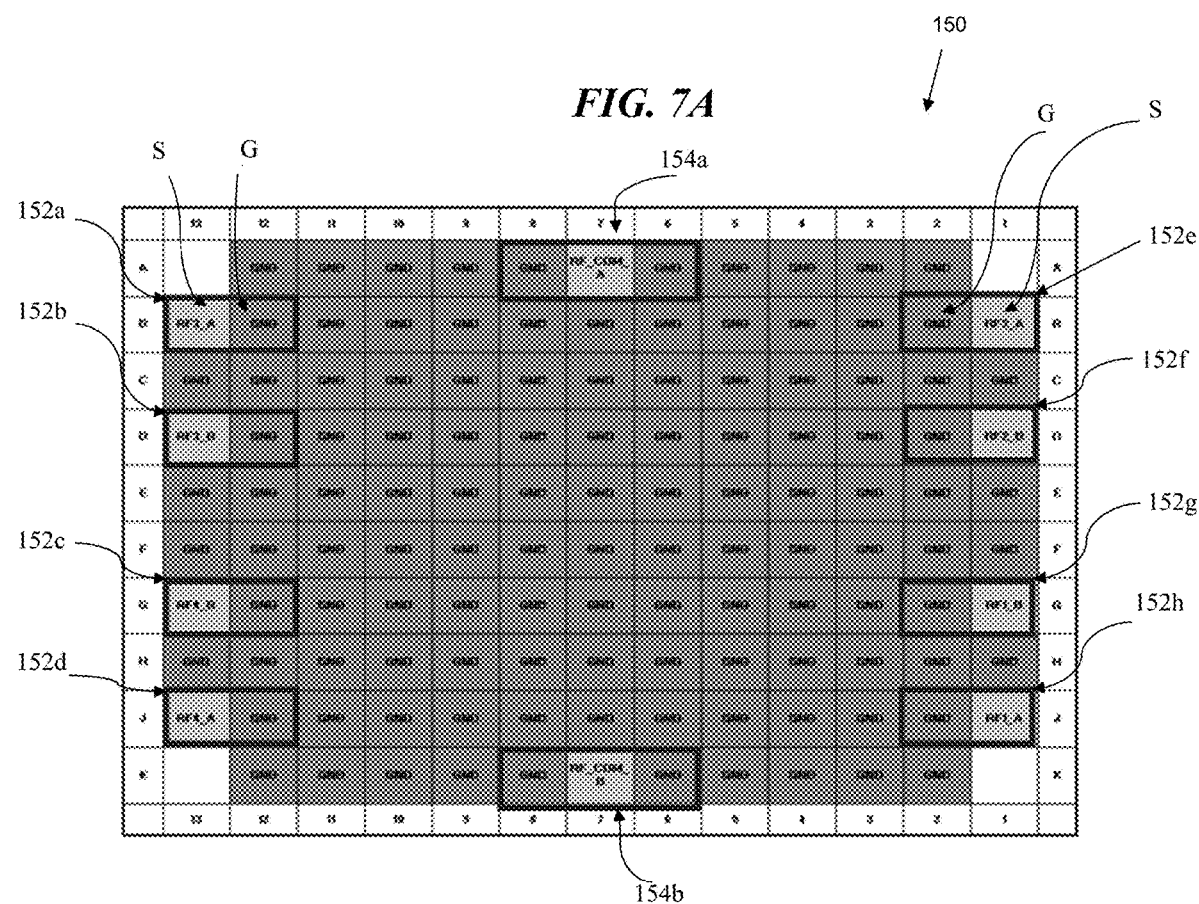
FIG. 7A schematically shows an exemplary representation of a beamforming integrated circuit that includes RF signal ports having a ground-signal (GS) pad layout configured in accordance with illustrative embodiments of the invention, e.g., for signal isolation.
Figure 7B:
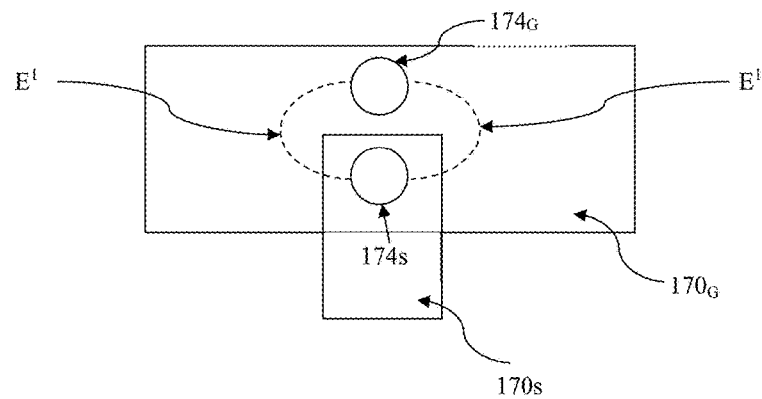
FIG. 7B schematically shows an exemplary RF signal port of the beamforming integrated circuit shown in FIG. 7A connected to respective signal and ground interfaces of on a printed circuit board.

For example, FIGS. 7A and 7B schematically show an illustrative embodiment of a beamforming integrated circuit 150 that includes RF antenna ports 152a, 152b, 152c, 152d, 152e, 152f, 152g, 152h, (collectively 152) and RF common ports 154a and 154b (collectively 154) that drive the RF antenna ports 152. As shown in FIG. 7A, each of the RF antenna ports 152 has a ground-signal (GS) pad layout for electromagnetically isolating the ports from one another. Each of the RF antenna ports 152 includes an RF signal pad S an internal RF ground pad G. For example, each RF signal pad S has a first side disposed on or adjacent to the edge of the integrated circuit 150 and an opposing second side that is adjacent to the internal RF ground pad G. The RF signal pad S and the internal RF ground pad G are oriented perpendicular with respect to the edge of the integrated circuit 150. Although the RF common ports 154 as shown have a GSG transition, persons skilled in the art will recognize that the RF common ports can also be configured to have a GS transition.

As shown in FIG. 7B, when the integrated circuit 150 is mounted on a PCB or other substrate, the RF signal pads S and the internal RF ground pads G of the RF antenna ports 152 are respectively connected to an RF signal interface 170$_S$ and an RF ground interface 170$_G$ of the PCB via solder bumps 174$_{S\ and}$ 174$_S$, respectively. As will be readily understood by a person skilled in the art, the GS transition from the integrated circuit 150 to the PCB can generate a symmetrical electromagnetic field F between RF signal and RF ground that carry RF current—and thereby electromagnetically isolate the port from surrounding RF ports.

By using a GS transition with an internal RF ground pad G, a single RF signal pad S on the edge of the integrated circuit die can be used to implement an RF signal port. The die size dependency on the number of RF ports (relative to GSG transitions) is therefore reduced by a factor of 3. Additionally, it is possible to increase the separation distance between the RF antenna ports 152 and the RF common ports 154. For example, in the illustrative 10×13 pad layout of FIG. 7A, the minimum achievable spacing between the RF antenna ports (e.g., 152a, 152e) and the RF common port (e.g., 154a) that drives them can be increased from one (1) pad location to four (4) pad locations for increased signal isolation (most coupling mechanism due to delta in signal levels). Additionally, as shown, the number of RF antenna ports 152 placed on the same edge of the integrated circuit can be increased. In some illustrative embodiments, such increases in separation distance can maintain signal isolation between RF antenna ports 152 in a range greater than approximately 40 decibels (dB) in the 28 GHz band.

Figure 8:
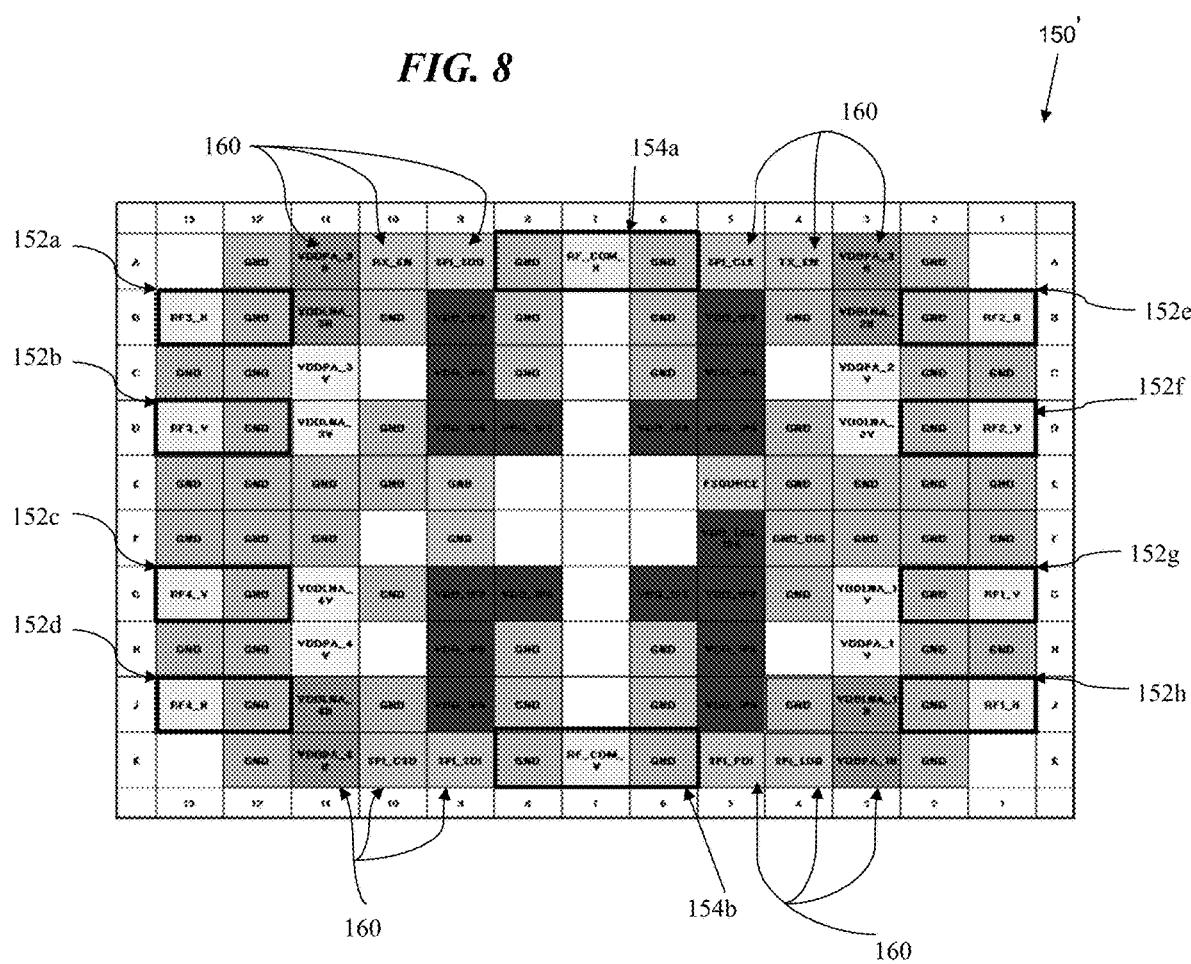
FIG. 8 schematically shows another exemplary representation of a beamforming integrated circuit that includes RF antenna ports having a ground-signal (GS) pad layout configured in accordance with illustrative embodiments of the invention, e.g., to release more pads along the edge of the integrated circuit for other purposes.

As shown in FIG. 8, in addition to the improved isolation, the proposed GS transition method can release more pads 160 located on the perimeter of the integrated circuit die 150' to be used for other purposes. For example, such pads can be used for purposes such as digital inputs/outputs (e.g., clock lines SPI_CLK, serial data inputs SPI_SDI, serial data outputs SPI_SDO, parallel data inputs SPI_PDI, parallel data outputs SPI_PDO, chip select inputs SPI_CSB, load enable inputs SPI_LDB) or supply pins (e.g., voltage inputs VDDx) that would otherwise be required to be located internal to the die. Using internal pads of an integrated circuit for these purposes can complicate the printed circuit board in terms of the types of vias required between routing layers which will increase the overall cost.

Figure 9A:
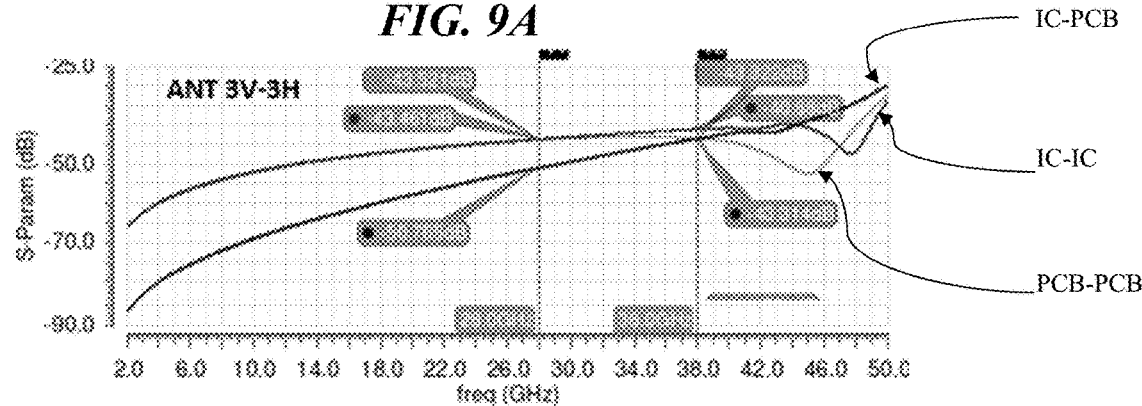
FIGS. 9A, 9B, and 9C are graphs that illustrate exemplary magnitudes of isolation (in decibels) between adjacent RF antenna ports of the beamforming integrated circuit shown in FIG. 8 at different signal frequencies, each RF antenna port having a GS transition from the beamforming integrated circuit to a printed circuit board in accordance with illustrative embodiments.
Figure 9B:
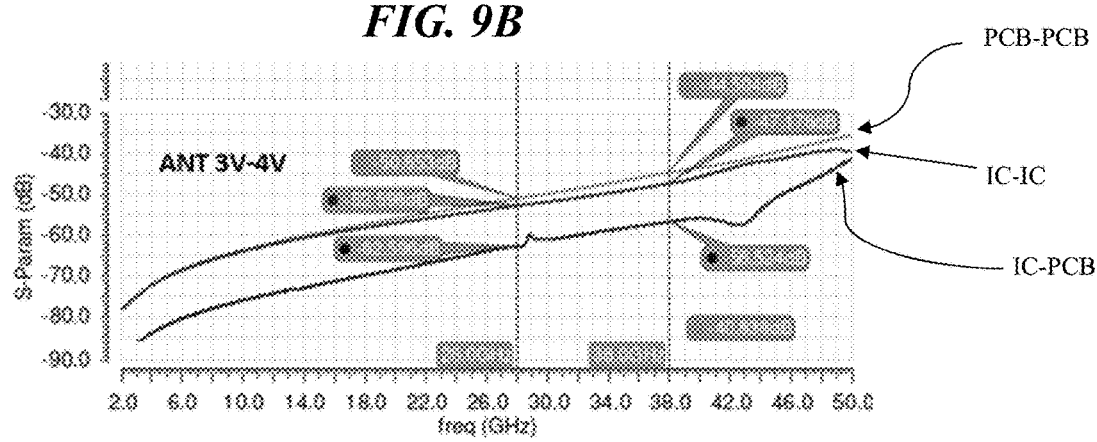
Figure 9C:
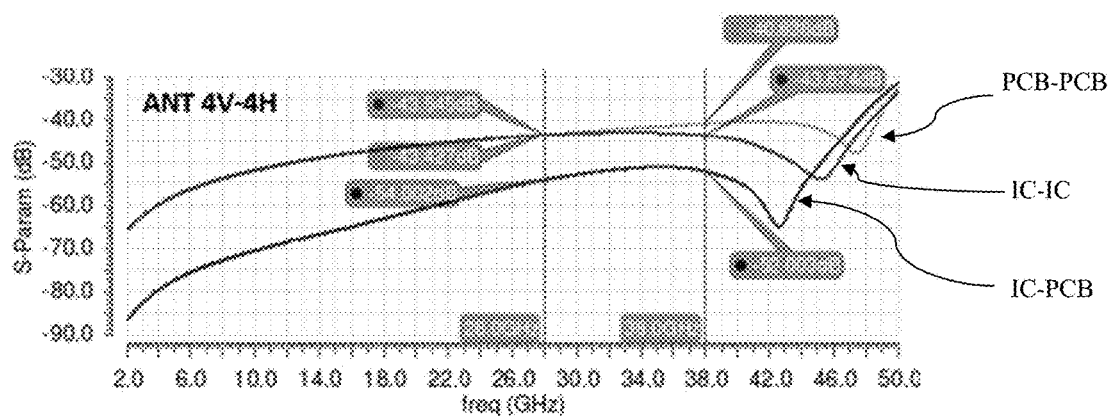

FIGS. 9A, 9B, and 9C are graphs that illustrate exemplary magnitudes of isolation (in decibels) between adjacent RF antenna ports 152a, 152b, 152c, 152d of the beamforming integrated circuit 150' shown in FIG. 8 at different signal frequencies. Each RF antenna port has a GS transition from the beamforming integrated circuit to a printed circuit board in accordance with illustrative embodiments. In FIG. 9A, the magnitude of isolation is measured between a horizontally polarized RF antenna port 152a and a vertically polarized RF antenna port 152b, separated by a single ground pad. In FIG. 9B, the magnitude of isolation is measured between vertically polarized RF antenna ports 152b and 152c, separated by a two ground pads. In FIG. 9C, the magnitude of isolation is measured between a vertically polarized RF antenna port 152c and a horizontally polarized RF antenna port 152d, separated by a single ground pad. Each graph shows the magnitude of isolation between the adjacent ports with respect as measured on the integrated circuit 150', a printed circuit board (e.g. 16), and between the integrated circuit and printed circuit board.

In some embodiments, the electromagnetic isolation between all ports as measured on the integrated circuit 150' can exceed 40 decibels (dB) for signals in the range between approximately 28 gigahertz (GHz) and approximately 38 GHz. For example, as shown in FIGS. 9A and 9C, the electromagnetic isolation between a horizontally polarized RF antenna port (152a/152d) and a vertically polarized RF antenna port (152b/152c) can be equal to or greater than approximately 43.5 dB for signals at approximately 28 GHz and equal to or greater than approximately 40.8 dB for signals at approximately 38 GHz. As shown in FIG. 9B, the electromagnetic isolation between vertically polarized RF antenna ports 152*b* and 152*c* can be equal to or greater than approximately 50.8 dB for signals at approximately 28 GHz and equal to or greater than approximately 44.5 dB for signals at approximately 38 GHz. These isolation measurements can result in ±0.1 dB and ±1 dB degree of amplitude and phase error, respectively.

Figure 10A:
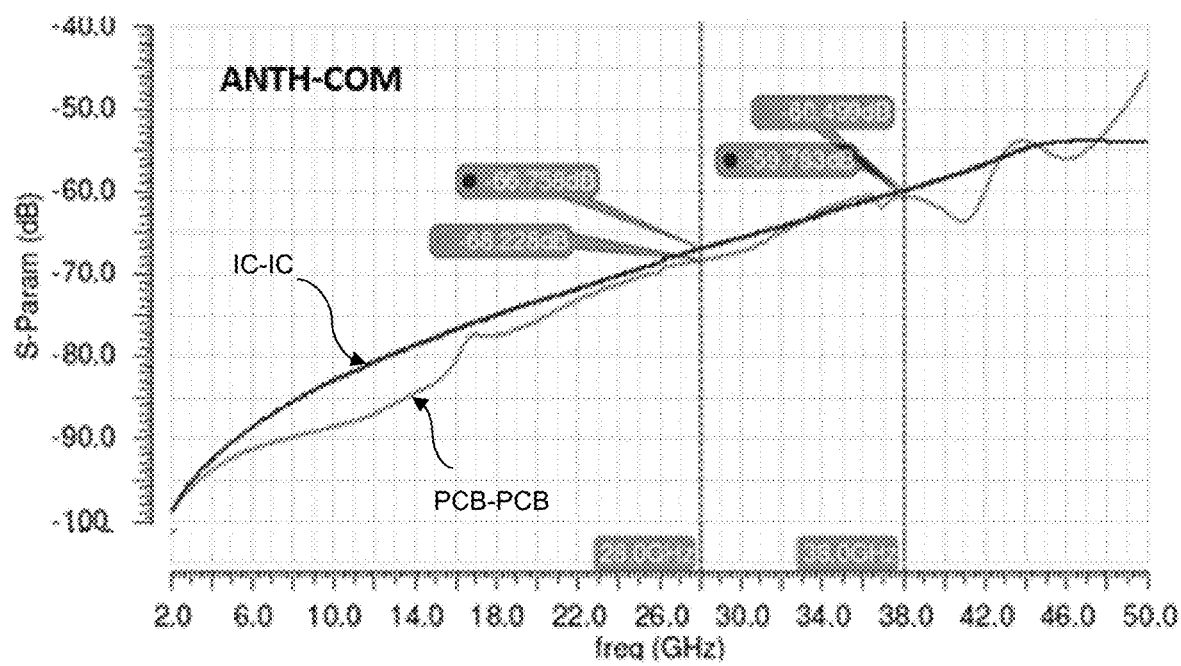
FIGS. 10A and 10B are graphs that illustrate exemplary magnitudes of isolation (in decibels) between an RF common port and an RF antenna port of the beamforming integrated circuit shown in FIG. 8 at different signal frequencies, each RF antenna port having a GS transition from the beamforming integrated circuit to a printed circuit board in accordance with illustrative embodiments.
Figure 10B:
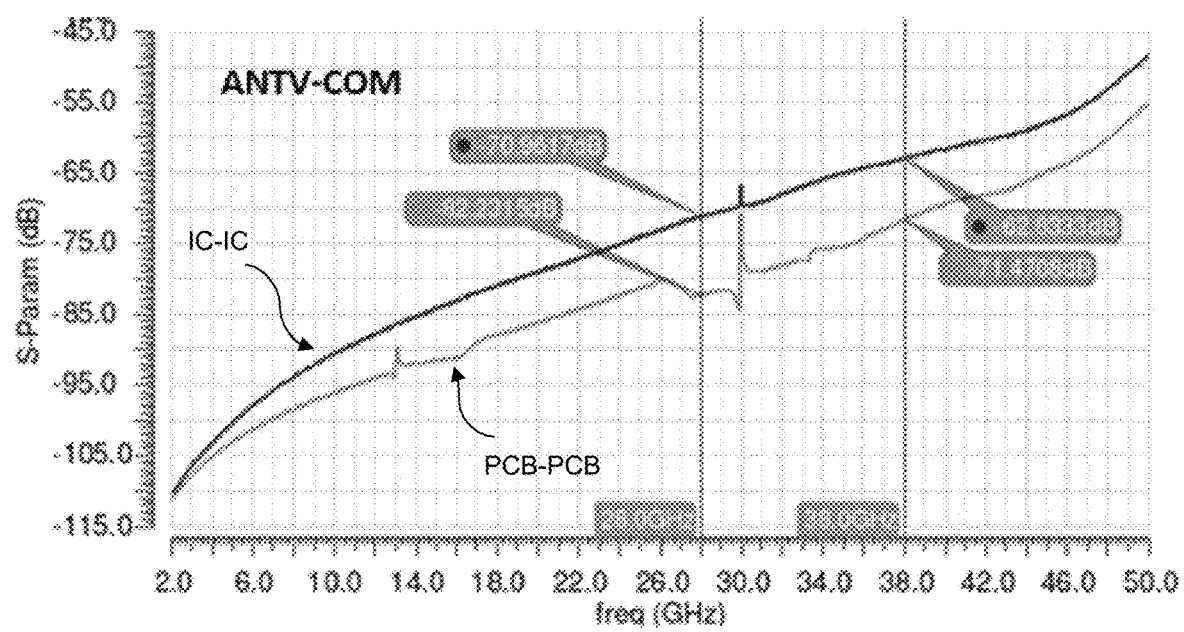

FIGS. 10A and 10B are graphs that illustrate exemplary magnitudes of isolation (in decibels) between RF common ports and RF antenna ports of the beamforming integrated circuit 150' shown in FIG. 8 at different signal frequencies. Each RF antenna port has a GS transition from the beamforming integrated circuit to a printed circuit board in accordance with illustrative embodiments. For example, in FIG. 10A, the magnitude of isolation is measured between an RF common port 154*a* and a horizontally polarized RF antenna port 152*a*, separated by at least four pad locations. In FIG. 9B, the magnitude of isolation is measured between an RF common port 154*b* and a vertically polarized RF antenna port 152*c*, separated by at least four pad locations.

Each graph shows the magnitude of isolation between the adjacent ports as measured on the integrated circuit 150' and as measured on a PCB can exceed 60 db for signals in the range between approximately 28.0 gigahertz (GHz) and approximately 38.0 GHz (assuming a 20 dB gain between the ports). For example, in FIG. 10A, the magnitude of isolation as measured on the integrated circuit 150' between the common port 154*a* and the horizontally polarized RF antenna port 152*a* can be equal to or greater than approximately 66.758 dB for signals at approximately 28 GHz and equal to or greater than approximately 59.763 dB for signals at approximately 38 GHz. In FIG. 10B, the magnitude of isolation as measured on the integrated circuit 150' between the common port 154*b* and the vertically polarized RF antenna port 152*c* can be equal to or greater than approximately 70.9617 dB for signals at approximately 28 GHz and equal to or greater than approximately 62.8333 dB for signals at approximately 38 GHz.

Figure 11A:
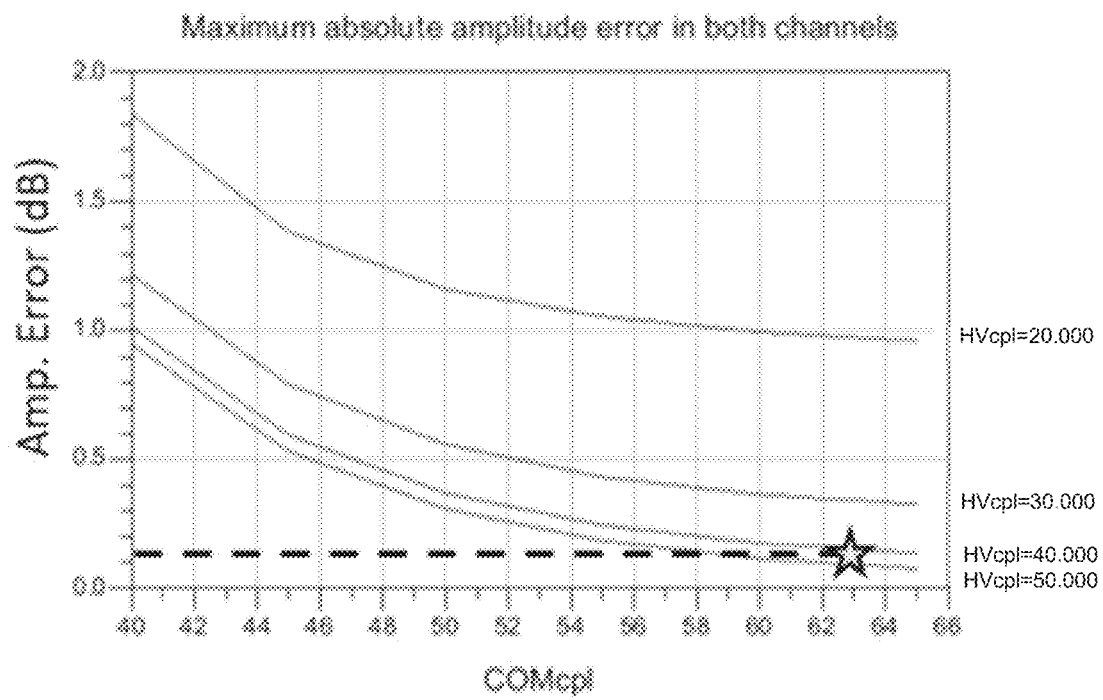
FIGS. 11A and 11B are graphs that illustrate minimizing amplitude and phase errors associated with an RF signal channel by maximizing signal isolation between an RF antenna port and an RF common port of the channel and between adjacent RF antenna ports.
Figure 11B:
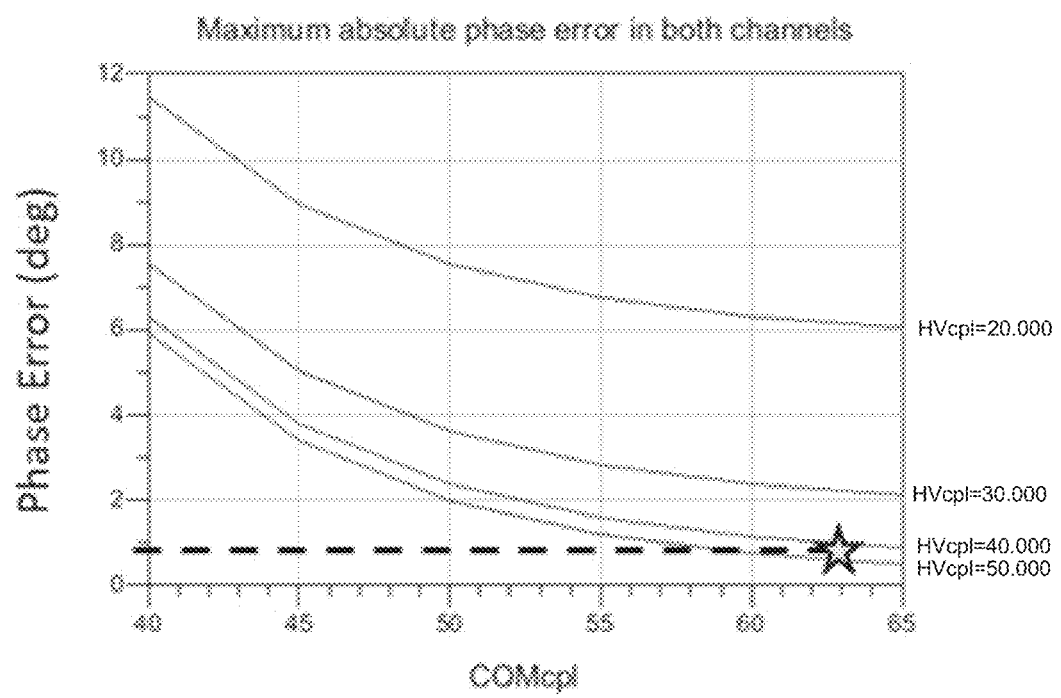

FIGS. 11A and 11B illustrate that amplitude and phase errors can be minimized in an RF signal channel by maximizing signal isolation between an RF antenna port and an RF common port of the channel as well as maximizing signal isolation between adjacent RF antenna ports.

Although the above discussion discloses various exemplary embodiments of the invention, it should be apparent that those skilled in the art can make various modifications that will achieve some of the advantages of the invention without departing from the true scope of the invention.

What is claimed is:

1. A phased antenna array system, comprising:
a beamforming integrated circuit disposed on a substrate, the beamforming integrated circuit including a plurality of radio frequency (RF) signal ports; and
a plurality of beamforming elements disposed on the substrate in communication with the beamforming integrated circuit,
wherein one or more of the plurality of RF signal ports comprises an RF signal pad disposed between an edge of the integrated circuit and an internal RF ground pad, wherein the RF signal pad and the internal RF ground pad of the one or more of the RF signal ports are oriented perpendicular with respect to the edge of the integrated circuit, and wherein the RF signal pad is electrically connected to an RF signal interface of the substrate and the internal RF ground pad is electrically connected to an RF ground interface of the substrate to form a ground-signal (GS) transition between the beamforming integrated circuit and the substrate that generates a symmetrical electromagnetic field between the RF signal and the RF ground pad that carries RF current to thereby electromagnetically isolate each of the RF ports from surrounding RF ports.

2. The phased antenna array system of claim 1, wherein the RF signal pad has a first side disposed on or adjacent to the edge of the integrated circuit and an opposing second side that is adjacent to the internal RF ground pad.

3. The phased antenna array system of claim 1, wherein the plurality of RF signal ports comprises at least one RF common port for connecting to RF circuitry disposed on the substrate and at least one RF antenna port for connecting to at least one of the beamforming elements disposed on the substrate.

4. The phased antenna array system of claim 3, wherein the at least one RF common port and the at least one RF antenna port are separated by at least four pad locations on the integrated circuit.

5. The phased antenna array system of claim 3, wherein the at least one RF antenna port comprises a plurality of RF antenna ports separated by at least one pad location on the integrated circuit.

6. The phased antenna array system of claim 3, wherein each RF antenna port comprises an RF signal pad disposed between an edge of the integrated circuit and an internal RF ground pad, and wherein the RF antenna ports are disposed on first and second opposing edges of the integrated circuit and each RF common port is disposed on an edge other than the first and second opposing edges.

7. A beamforming integrated circuit comprising:
a plurality of radio frequency (RF) signal ports,
wherein one or more of the plurality of RF signal ports comprises an RF signal pad disposed between an edge of the integrated circuit and an internal RF ground pad, wherein the RF signal pad and the internal RF ground pad of the one or more of the RF signal ports are oriented perpendicular with respect to the edge of the integrated circuit, and wherein the RF signal pad and the RF ground pad are configured to form a ground-signal (GS) transition that generates a symmetrical electromagnetic field between the RF signal pad and the RF ground pad that carries RF current to thereby electromagnetically isolate each of the RF ports from surrounding RF ports when the RF signal pad is electrically connected to an RF signal interface of a substrate and the internal RF ground pad is electrically connected to an RF ground interface of the substrate.

8. The beamforming integrated circuit of claim 7, wherein the RF signal pad has a first side disposed on or adjacent to the edge of the integrated circuit and an opposing second side that is adjacent to the internal RF ground pad.

9. The beamforming integrated circuit of claim 7, wherein the plurality of RF signal ports comprises at least one RF common port for connecting to RF circuitry disposed on the substrate and at least one RF antenna port for connecting to at least one of the beamforming elements disposed on the substrate.

10. The beamforming integrated circuit of claim 9, wherein the at least one RF common port and the at least one RF antenna port are separated by at least four pad locations on the integrated circuit.

11. The beamforming integrated circuit of claim 9, wherein the at least one RF antenna port comprises a plurality of RF antenna ports separated by at least one pad location on the integrated circuit.

12. The beamforming integrated circuit of claim 9, wherein each RF antenna port comprises an RF signal pad disposed between an edge of the integrated circuit and an internal RF ground pad, and wherein the RF antenna ports are disposed on first and second opposing edges of the integrated circuit and each RF common port is disposed on an edge other than the first and second opposing edges.

* * * * *

UNITED STATES PATENT AND TRADEMARK OFFICE
CERTIFICATE OF CORRECTION

PATENT NO. : 11,205,846 B2  
APPLICATION NO. : 16/986846  
DATED : December 21, 2021  
INVENTOR(S) : Kevin Greene et al.

Page 1 of 1

It is certified that error appears in the above-identified patent and that said Letters Patent is hereby corrected as shown below:

In the Claims

At Column 12, Claim number 1, Line number 2, please replace "the RF signal and the RF ground pad that carries RF" with --the RF signal pad and the RF ground pad that carries RF--.

Signed and Sealed this  
Fifteenth Day of February, 2022

Drew Hirshfeld  
*Performing the Functions and Duties of the*  
*Under Secretary of Commerce for Intellectual Property and*  
*Director of the United States Patent and Trademark Office*